(12) United States Patent
Hemmer et al.

(10) Patent No.: US 9,595,976 B1
(45) Date of Patent: Mar. 14, 2017

(54) FOLDED INTEGER ENCODING

(71) Applicant: GOOGLE INC., Mountain View, CA (US)

(72) Inventors: Michael Hemmer, San Francisco, CA (US); Ondrej Stava, San Jose, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 15/268,248

(22) Filed: Sep. 16, 2016

(51) Int. Cl.
  *H03M 7/34* (2006.01)
  *H03M 7/30* (2006.01)
  *H03M 7/40* (2006.01)

(52) U.S. Cl.
  CPC ....... *H03M 7/3084* (2013.01); *H03M 7/4006* (2013.01)

(58) Field of Classification Search
  CPC . H03M 7/3084; H03M 7/4006; H03M 7/4043
  USPC .................... 341/50, 51, 65, 67, 87
  See application file for complete search history.

(56) References Cited

U.S. PATENT DOCUMENTS 6,633,242 B2 * 10/2003 Brown ............... H03M 7/40
  341/50
8,593,310 B1 * 11/2013 Zhang ............... H03M 7/40
  341/65

OTHER PUBLICATIONS

Duda, "Asymmetric numeral systems: entropy coding combining speed of Huffman coding with compression rate of arithmetic coding", Cornell University Library (http://arxiv.org/abs/1311.2540v2), Jan. 6, 2014, 24 pages.

* cited by examiner

*Primary Examiner* — Khai M Nguyen
(74) *Attorney, Agent, or Firm* — Brake Hughes Bellermann LLP

(57) ABSTRACT

Techniques of data compression involve performing a separate compression operation on each set of corresponding bits of a sequence of bit strings in which each bit string represents a number having an upper bound. Advantageously, compressing the sets of corresponding bits produces an improved compression ratio over compressing each number in the sequence. Further, decompression is straightforward as long as sequence order is preserved and the upper bound of each number in the sequence is known.

20 Claims, 7 Drawing Sheets

| | | | | | | | | | |
|---|---|---|---|---|---|---|---|---|---|
| Point 310(1) | 0 | 0 | 0 | 1 | 1 | 0 | 0 | 5 | Upper Bound Data 320 |
| Point 310(2) | 0 | 0 | 0 | 0 | 0 | 1 | 0 | 3 | |
| Point 310(3) | 0 | 0 | 0 | 0 | 1 | 0 | 0 | 5 | |
| Point 310(4) | 0 | 0 | 1 | 1 | 0 | 1 | 0 | 6 | |
| Point 310(5) | 0 | 0 | 0 | 0 | 0 | 1 | 1 | 2 | |
| Point 310(6) | 0 | 0 | 0 | 0 | 1 | 0 | 1 | 4 | |
| ... | | | | | | | | ... | |
| Point 310(M) | 0 | 0 | 1 | 1 | 1 | 1 | 0 | 6 | |

FIG. 3A

FOLDED INTEGER ENCODING

TECHNICAL FIELD

This description relates to data compression.

BACKGROUND

Many data-acquisition activities result in large sequences of numbers that are stored in some form of storage media. A common problem involves compressing the sequence of numbers to save storage space. The solution to such a problem may involve an entropy encoding scheme such as Huffman encoding.

SUMMARY

In one general aspect, a computer-implemented method can include receiving, by processing circuitry of the computer, a first plurality of bit strings. The computer-implemented method can also include producing, by the processing circuitry, upper bound data based on the first plurality of bit strings, the upper bound data indicating, for each of the first plurality of bit strings, a leftmost bit of that bit string. The computer-implemented method can further include generating, by the processing circuitry, a second plurality of bit strings from the first plurality of bit strings and the upper bound data, each of the second plurality of bit strings including a bit from a respective bit string of the first plurality of bit strings, each bit of each of the second plurality of bit strings having the same position from the leftmost bit indicated by the upper bound data of its respective bit string of the first plurality of bit strings. The computer-implemented method can further include performing, by the processing circuitry, a compression operation on each of the second plurality of bit strings to (i) produce a plurality of compressed bit strings and (ii) reduce an amount of storage in a storage device of the computer consumed by the plurality of compressed bit strings by the performance of a compression operation on each of the second plurality of bit strings rather than each of the first plurality of bit strings.

The details of one or more implementations are set forth in the accompanying drawings and the description below. Other features will be apparent from the description and drawings, and from the claims.

BRIEF DESCRIPTION OF THE DRAWINGS

FIG. 3A is a diagram that illustrates an example set of bit strings shown in FIG. 1.

DETAILED DESCRIPTION

A large amount of numerical data such as that representing subdivisions of a point cloud uses an enormous amount of storage and processing resources. Conventional compression techniques such as arithmetic coding are able to reduce the storage and processing requirements somewhat. However, such conventional compression techniques do not take into account certain structural properties of such subdivisions. Therefore, for data such as point cloud subdivision data, conventional compression techniques may be suboptimal.

In accordance with the implementations described herein and in contrast with the above-described conventional techniques of data compression, improved techniques involve performing a separate compression operation on each set of corresponding bits of a sequence of bit strings in which each bit string represents a number having an upper bound. Advantageously, compressing the sets of corresponding bits produces an improved compression ratio over compressing each bit string in the sequence. Further, decompression is straightforward as long as sequence order is preserved and the upper bound of each number in the sequence is known.

Figure 1:
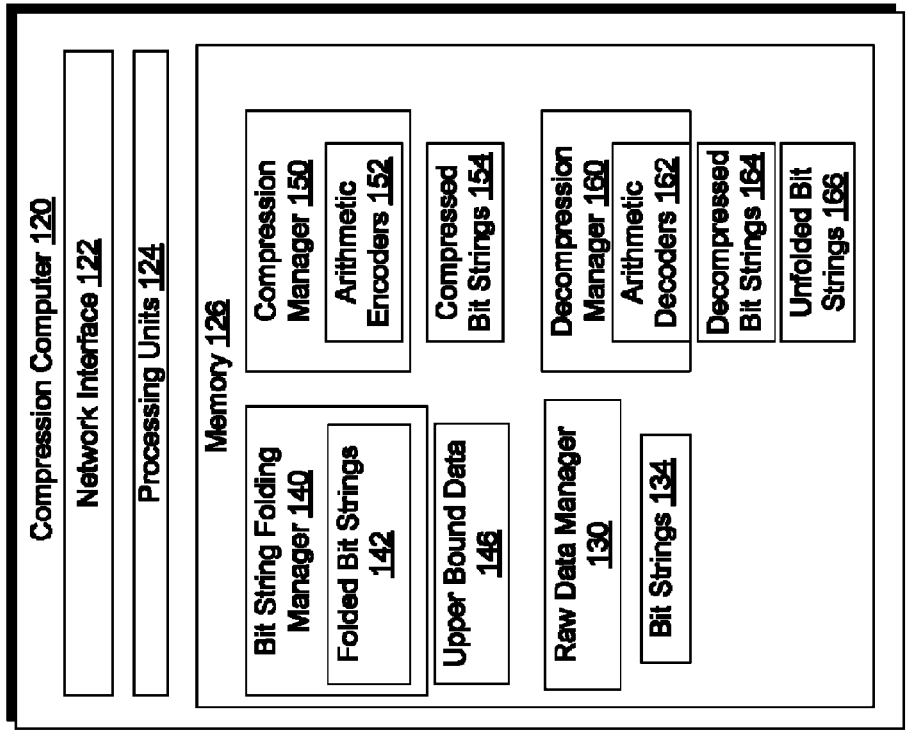
FIG. 1 is a diagram that illustrates an example electronic environment in which improved techniques described herein may be implemented.

FIG. 1 is a diagram that illustrates an example electronic environment 100 in which the above-described improved techniques may be implemented. As shown, in FIG. 1, the electronic environment 100 includes a compression computer 120.

The compression computer 120 is configured to receive a sequence of bit strings, perform compression operations to reduce the burden of storing the bit strings, and perform decompression operations to recover the sequence of bit strings. In some implementations, the compression computer 120 may be a server computer but can also be a desktop computer, a laptop computer, a tablet computer, a smartphone, or the like.

The compression computer 120 includes a network interface 122, one or more processing units 124, and memory 126. The network interface 122 includes, for example, Ethernet adaptors, Token Ring adaptors, and the like, for converting electronic and/or optical signals received from the network 170 to electronic form for use by the point cloud compression computer 120. The set of processing units 124 include one or more processing chips and/or assemblies. The memory 126 includes both volatile memory (e.g., RAM) and non-volatile memory, such as one or more ROMs, disk drives, solid state drives, and the like. The set of processing units 124 and the memory 126 together form control circuitry, which is configured and arranged to carry out various methods and functions as described herein.

In some embodiments, one or more of the components of the compression computer 120 can be, or can include processors (e.g., processing units 124) configured to process instructions stored in the memory 126. Examples of such instructions as depicted in FIG. 1 include a raw data manager 130, a bit string folding manager 140, a compression manager 150, and a decompression manager 160. Further, as illustrated in FIG. 1, the memory 126 is configured to store various data, which is described with respect to the respective managers that use such data.

The raw data manager 130 is configured to receive and store bit strings 134. The bit strings 134 may consume a large amount of storage. Accordingly, in some implementations, these data are stored in non-volatile storage media such as a magnetic disk drive, a solid-state drive, and the like. However, in other implementations, there may not be a need for the raw data manager 130 as the bit strings 134 may already be present in the memory 126 (i.e., generated by the processing units 124).

Further, in some implementations, each bit string 134 has a corresponding upper bound which may be a number of bits occupied by some previous bit string 134. For example, in cases where the bit strings represent numbers of points within subdivisions of a bounding box as described above, such an upper bound may be indicative of a maximum estimate of a number of points within a subdivision. For example, the upper bound may be the number of bits in a bit string representing a number of points in a previous subdivision. For example, suppose that a bounding box enclosing N points is split in two (not necessarily equal) pieces along one direction, e.g., the x-direction. There are N1 points to the left of the split and N−N1 points to the right of the split. For the N1 points to the left, N represents an upper bound, with the number of bits and therefore a leftmost bit being the integer part of $\log_2$ N.

In some implementations, the bit strings 134 are received by the compression computer 120 in a particular order corresponding to a subdivision sequence known in advance. For example, the bounding box may be split in the x-direction first, then the y-direction, then the z-direction, and then repeating this pattern. However, in other implementations, the bounding box may be split in any order. In this case, the compression computer 120 might receive additional data specifying the subdivision sequence.

Finally, the raw data manager 130 is configured to delete the bit strings 134 upon folding operations and/or compression operations being performed.

The bit string folding manager 140 is configured to generate a set of folded bit strings 142 from the bit strings 134. Each folded bit string contains a bit from at least one of the bit strings 134 according to the position of that bit. In some implementations, the second plurality of bit strings is generated from the first plurality of bit strings in a sequence. In this case, a bit from a particular bit string 134 is added each of the folded bit strings 142 according to whether the leftmost bit of the particular bit string (expressed in the upper bound data) is greater than or less than the sequence number of that folded bit string 142 in the sequence.

Along these lines, the first folded bit string 142 would include the leftmost bit from each of the bit strings 134. The second folded bit string 142 would include the next leftmost bit from each of the bit strings 134, and so on.

It should be noted that some folded bit strings 142 may not contain bits of all of the bit strings 134 because the bit strings 134 may have different lengths. Again, such lengths are expressed in the upper bound data 146. The upper bound data 146 are used by the decompression manager to unfold decompressed bit strings.

It should also be noted that the upper bound data 146 is not typically stored in the memory 126. Rather, the compression computer 120 is, e.g., configured to generate an upper bound datum in place by computing the logarithm base two of a previous bit string 134. However, in some implementations, the upper bound data is stored in the memory 126. In further implementations, the upper bound data is stored in memory external to the compression computer 120.

The compression manager 150 is configured to apply an encoding scheme to compress the folded bit strings 142 into compressed bit strings 154. As depicted in FIG. 1, the compression manager 150 uses arithmetic decoders 152 to perform the compression on each of the folded bit strings 142. In some implementations, the arithmetic decoders 152 are adaptive, i.e., the probability distributions of the symbols used by the encoders at a present time depends on the frequencies of the symbols at previous times. However, in other implementations, the compression manager may use other encoders, i.e., Huffman encoders, asymmetrical number systems, and the like.

The decompression manager 160 is configured to apply a decoding scheme to decompress the compressed bit strings 154 to produce decompressed bit strings 164. If the decompression scheme functions properly, then the decompressed bit strings 164 are essentially equivalent to the folded bit strings 142. The decoders, in this case, arithmetic decoders 162, correspond respectively to the arithmetic encoders 152.

The decompression manager 160 is also configured to perform an unfolding operation on the decompressed bit strings to recover the original bit strings 134 to produce unfolded bit strings 166. If the unfolding functions properly, then the unfolded bit strings 166 are equivalent to the bit strings 134. In performing the unfolding operation, the decompression manager 160 is configured to use the upper bound data 146 to determine where each unfolded bit string 166 terminates.

In some implementations, the memory 126 can be any type of memory such as a random-access memory, a disk drive memory, flash memory, and/or so forth. In some implementations, the memory 126 can be implemented as more than one memory component (e.g., more than one RAM component or disk drive memory) associated with the components of the user device 120. In some implementations, the memory 126 can be a database memory. In some implementations, the memory 126 can be, or can include, a non-local memory. For example, the memory 126 can be, or can include, a memory shared by multiple devices (not shown). In some implementations, the memory 126 can be associated with a server device (not shown) within a network and configured to serve the components of the user device 120.

The components (e.g., modules, processing units 124) of the compression computer 120 can be configured to operate based on one or more platforms (e.g., one or more similar or different platforms) that can include one or more types of hardware, software, firmware, operating systems, runtime libraries, and/or so forth. In some implementations, the components of the compression computer 120 can be configured to operate within a cluster of devices (e.g., a server farm). In such an implementation, the functionality and processing of the components of the compression computer 120 can be distributed to several devices of the cluster of devices.

The components of the compression computer 120 can be, or can include, any type of hardware and/or software configured to process attributes. In some implementations, one or more portions of the components shown in the components of the compression computer 120 in FIG. 1 can be, or can include, a hardware-based module (e.g., a digital signal processor (DSP), a field programmable gate array (FPGA), a memory), a firmware module, and/or a software-based module (e.g., a module of computer code, a set of computer-readable instructions that can be executed at a computer). For example, in some implementations, one or more portions of the components of the compression computer 120 can be, or can include, a software module configured for execution by at least one processor (not shown). In some implementations, the functionality of the components can be included in different modules and/or different components than those shown in FIG. 1.

Although not shown, in some implementations, the components of the compression computer 120 (or portions thereof) can be configured to operate within, for example, a data center (e.g., a cloud computing environment), a computer system, one or more server/host devices, and/or so forth. In some implementations, the components of the compression computer 120 (or portions thereof) can be configured to operate within a network. Thus, the components of the compression computer 120 (or portions thereof) can be configured to function within various types of network environments that can include one or more devices and/or one or more server devices. For example, the network can be, or can include, a local area network (LAN), a wide area network (WAN), and/or so forth. The network can be, or can include, a wireless network and/or wireless network implemented using, for example, gateway devices, bridges, switches, and/or so forth. The network can include one or more segments and/or can have portions based on various protocols such as Internet Protocol (IP) and/or a proprietary protocol. The network can include at least a portion of the Internet.

In some embodiments, one or more of the components of the compression computer 120 can be, or can include, processors configured to process instructions stored in a memory. For example, the raw data manager 130 (and/or a portion thereof), the bit string folding manager 140 (and/or a portion thereof), the compression manager 150 (and/or a portion thereof), and the decompression manager 160 (and/or a portion thereof) can be a combination of a processor and a memory configured to execute instructions related to a process to implement one or more functions.

Figure 2:
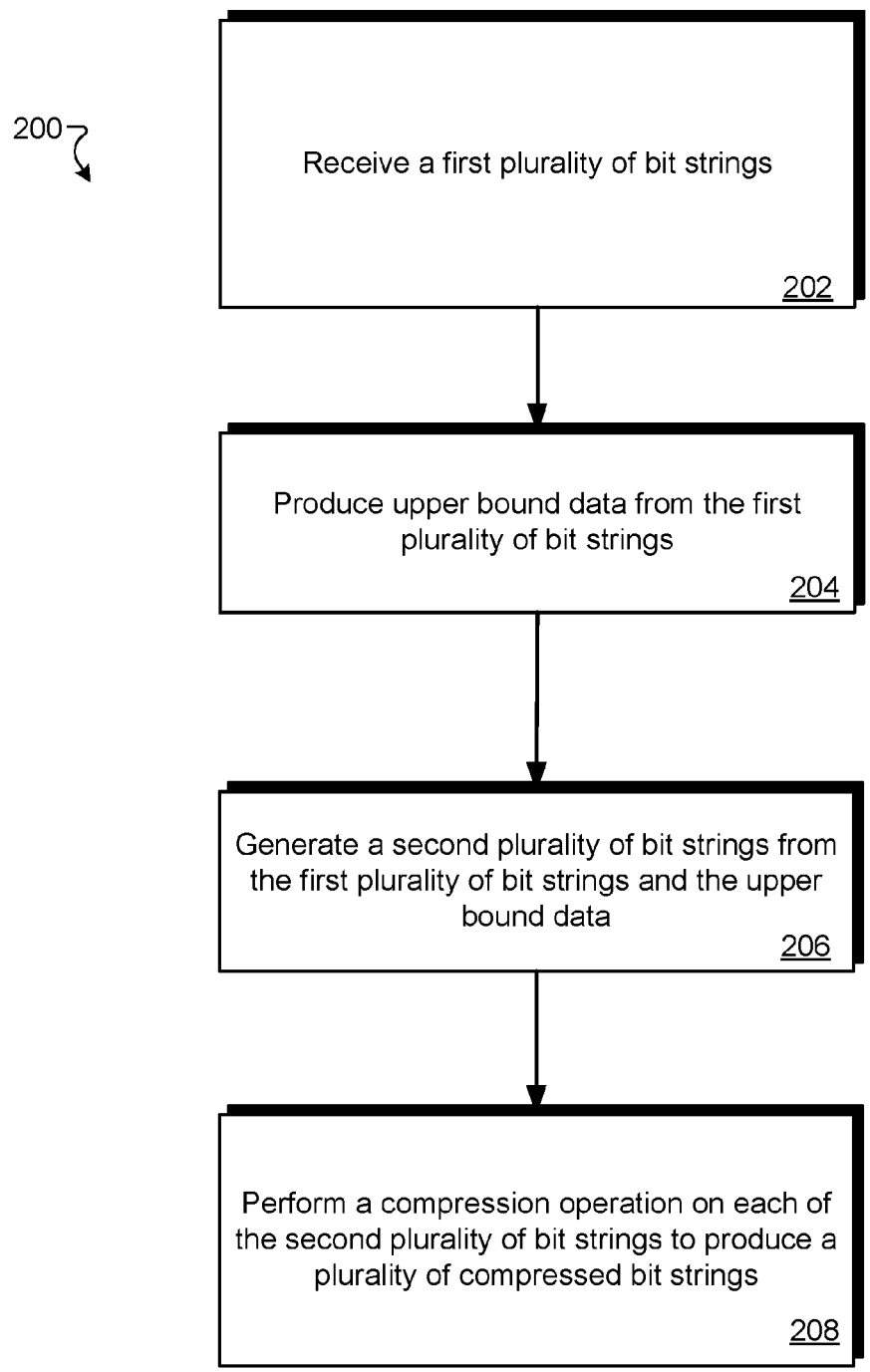
FIG. 2 is a flow chart that illustrates an example method of implementing the improved techniques shown in FIG. 1.

FIG. 2 is a flow chart that illustrates an example method 200 of implementing the improved techniques shown in FIG. 1. The method 200 may be performed by software constructs described in connection with FIG. 1, which reside in memory 126 of the compression computer 120 and are run by the set of processing units 124.

At 202, a first plurality of bit strings (e.g., bit strings 134) is received. In some implementations, each bit string of the first plurality of bit strings may represent a number of points within a subdivision of a bounding box enclosing a point cloud.

At 204, upper bound data is produced from the received first plurality of strings. The upper bound data indicates a leftmost bit of each of the first plurality of bit strings that may not be zero, i.e., all bits to the left of the leftmost bit are guaranteed to be zero.

At 206, a second plurality of bit strings (e.g., folded bit strings 142) is generated from the first plurality of bit strings and the upper bound data. Each of the second plurality of bit strings includes a bit from a respective bit string of the first plurality of bit strings. Each bit of each of the second plurality of bit strings having the same position from the leftmost bit indicated by the upper bound data of its respective bit string of the first plurality of bit strings.

At 208, a compression operation is performed on each of the second plurality of bit strings to (i) produce a plurality of compressed bit strings and (ii) reduce an amount of storage in a storage device of a compression computer 120 consumed by the plurality of compressed bit strings by the performance of the compression operation on each of the second plurality of bit strings rather than each of the first plurality of bit strings.

FIG. 3A is a diagram that illustrates an example set of bit strings 134. FIG. 3A depicts M numbers 310(1), 310(2), . . . , 310(M), represented as bit strings. Each number, e.g., number 310(1), has a number of bits as given in the upper bound data 320 (5 in this case). The leftmost bit is shown to have a box around that bit. The leftmost bit of number 310(1) in the upper bound data 320 may be determined by a location of the number 310(1) within the bounding box 190 as described above, e.g., by the subdivision of the bounding box 190 in which the number 310(1) is located.

Figure 3B:
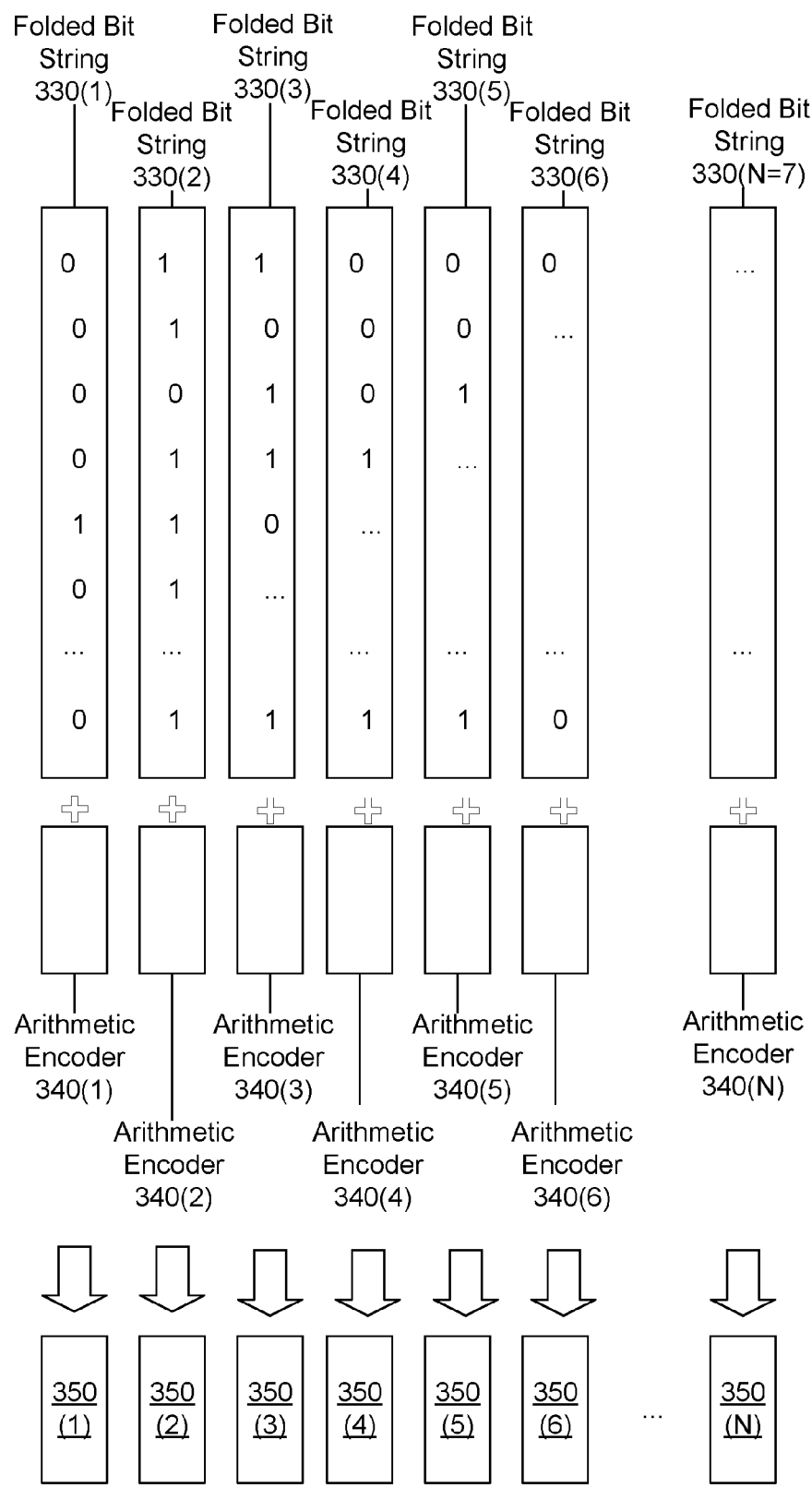
FIG. 3B is a diagram that illustrates an example set of folded bit strings derived from the bit strings shown in FIG. 3B.

FIG. 3C is a diagram that illustrates an example set of folded bit strings derived from the bit strings in FIG. 3B. Here, each folded bit string such as folded bit string 330(1) includes a bit from each bit string 310(1), . . . , 310(M). In the case of folded bit string 310(1), each bit is the leftmost bit from each bit string 310(1), . . . , 310(M). Other folded bit strings may have fewer bits according to how many bits are in each bit string 310(1), . . . , 310(M). For example, folded bit string 330(3) has one bit less than folded bit strings 330(1 and 330(2). Subsequent folded bit strings 330(4), . . . , 330(N) may have fewer bits still.

It is these folded bit strings 330(1), . . . , 330(N) that are compressed using, e.g., arithmetic encoders 340(1), . . . , 340(N) to produce compressed bit strings 350(1), . . . , 350(N). Each different arithmetic encoder, e.g., 340(1) provides a different context. The number of different contexts is determined here by the length of the bounding box 190. For example, the arithmetic encoder 340(1) may have a first set of symbols and a probability distribution of those symbols, while the arithmetic encoder 340(2) has a second set of symbols and a probability distribution of those symbols, and so on.

An advantage of performing compression in this way is that compressing the folded bit strings 330(1), . . . , 330(N) may result in a higher compression ratio than compressing bit strings 310(1), . . . , 310(M). A reason for this can be attributed to the fact the upper bound data already helps avoid encoding bits that are known to be zero. However, in many cases the upper bound is not sharp; this implies that the leading bits of the encoded part of a bit string are more likely to be zero. That is, it is advantageous to aggregate these bits in one context, i.e. bit string, and encode it separate from the others. This reason applies similarly for second bits and so forth.

Figure 4:
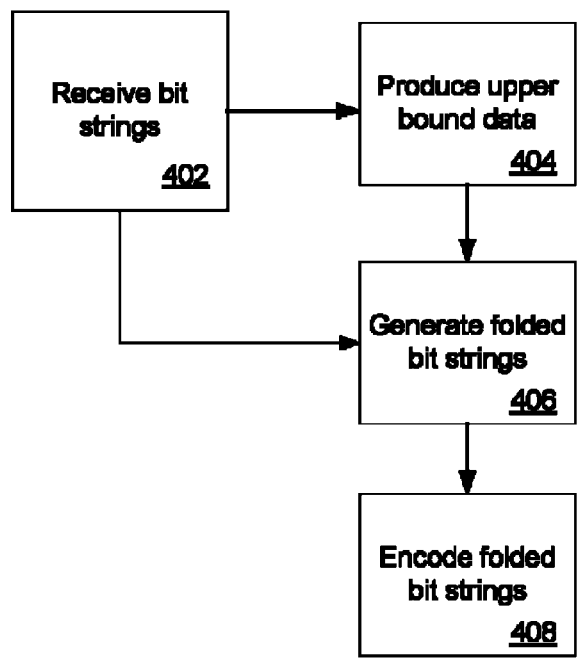
FIG. 4 is a flow chart that illustrates an example process of compressing data shown in FIG. 1.

FIG. 4 is a flow chart that illustrates an example process 400 of decompression to recover original bit strings. The process 400 may be performed by software constructs described in connection with FIG. 1, which reside in memory 126 of the user device 120 and are run by the set of processing units 124.

At 402, the compression computer 120 receives a large number of bit strings. The bit strings may originate from a source external to the compression computer 120. The bit strings may represent numbers derived from some physical process, e.g., distributions of points of a point cloud within a bounding box.

At 404, the compression computer 120 produces upper bound data from the bit strings it has received. For example, in the case where the bit strings represents distributions of points of a point cloud within various subregions of a bounding box, the first bit string may represents the total number of points. This total number may be an upper bound of the number represented by the second bit string, which number is the number of points in a first subdivision of the bounding box (e.g., along the x-axis). In turn, the number represented by the second bit string may be an upper bound of the third bit string, and so on. The upper bound data may be represented in terms of a maximum number of bits that a bit string may have.

At 406, the compression computer 120 generates folded bit strings from the bit strings and the upper bound data, as illustrated in FIGS. 3A and 3B.

At 408, the compression computer 120 encodes the folded bit strings to form compressed, folded bit strings.

Figure 5:
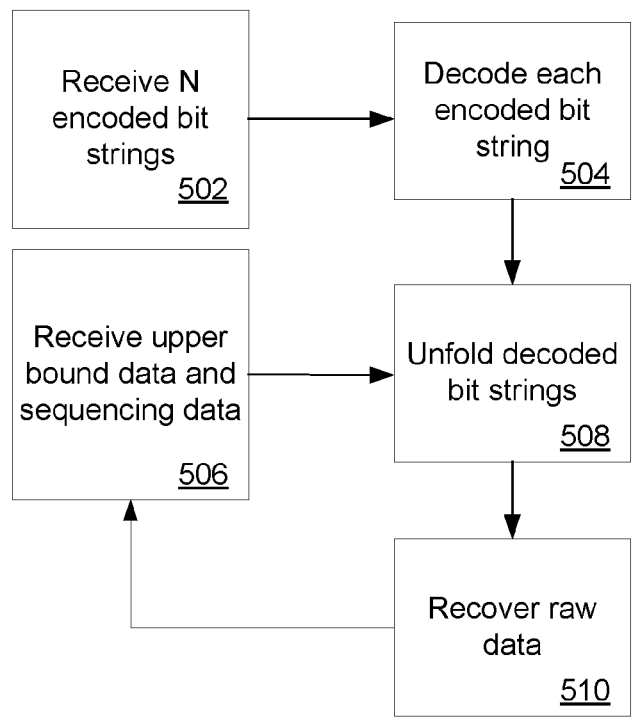
FIG. 5 is a flow chart that illustrates an example process of decompressing data shown in FIG. 1.

FIG. 5 is a flow chart that illustrates an example process 500 of decompression to recover original bit strings. The process 500 may be performed by software constructs described in connection with FIG. 1, which reside in memory 126 of the user device 120 and are run by the set of processing units 124.

At 502, the compression computer 120 receives N compressed bit strings. These N compressed bit strings are the result of performing a compression operation separately on each of a set of folded bit strings, e.g., folded bit strings 330(1), . . . , 330(N). In the examples discussed herein, the compression operations each involve application of an arithmetic encoding scheme.

At 504, the decompression manager 160 performs a decoding operation on each of the received compressed bit strings to produce N folded bit strings. In this case, for each compressed bit string, the decompression manager 160 uses an arithmetic decoder corresponding to the arithmetic encoder that was applied to a folded bit string to produce that compressed bit string. In other implementations, there may be N encoders and corresponding decoders that may be applied to the bit strings in parallel.

At 506, the compression computer 120 produces upper bound data used to unfold the folded bit strings, e.g., computes the logarithm base two of the number represented by a previously decoded bit string. In some implementations, the previously decoded bit string is immediately prior, while in other implementations the previously decoded bit string may represent a combination of other bit strings depending on the context in which this module is placed.

At 508, the decompression manager 160 unfolds the folded bit strings using the upper bound data. For example, consider the folded bit strings 330(1), . . . , 330(N) and the upper bound data 320. As the first upper bound datum indicates 5 bits, then the decompression manager 160 selects the first bit from each of the first 5 folded bit strings 330(1), . . . , 330(5). The decompression manager 160 may then (e.g., remove) delete these bits from those folded bit strings. The next upper bound datum indicates 3 bits; in this case, the decompression manager 160 selects the first bit from each of the first 3 folded bit strings 330(1), . . . , 330(3). This process is repeated until all of the bits of the folded bit strings have been selected.

The above examples assumed that the bit strings received by the compression computer 120 resulted from counting points in successive subdivisions of a bounding box enclosing a point cloud. However, the techniques discussed herein apply to any sequences of integers in which the numbers are smaller than an upper bound and in which smaller numbers are much more likely than larger numbers.

Figure 6:
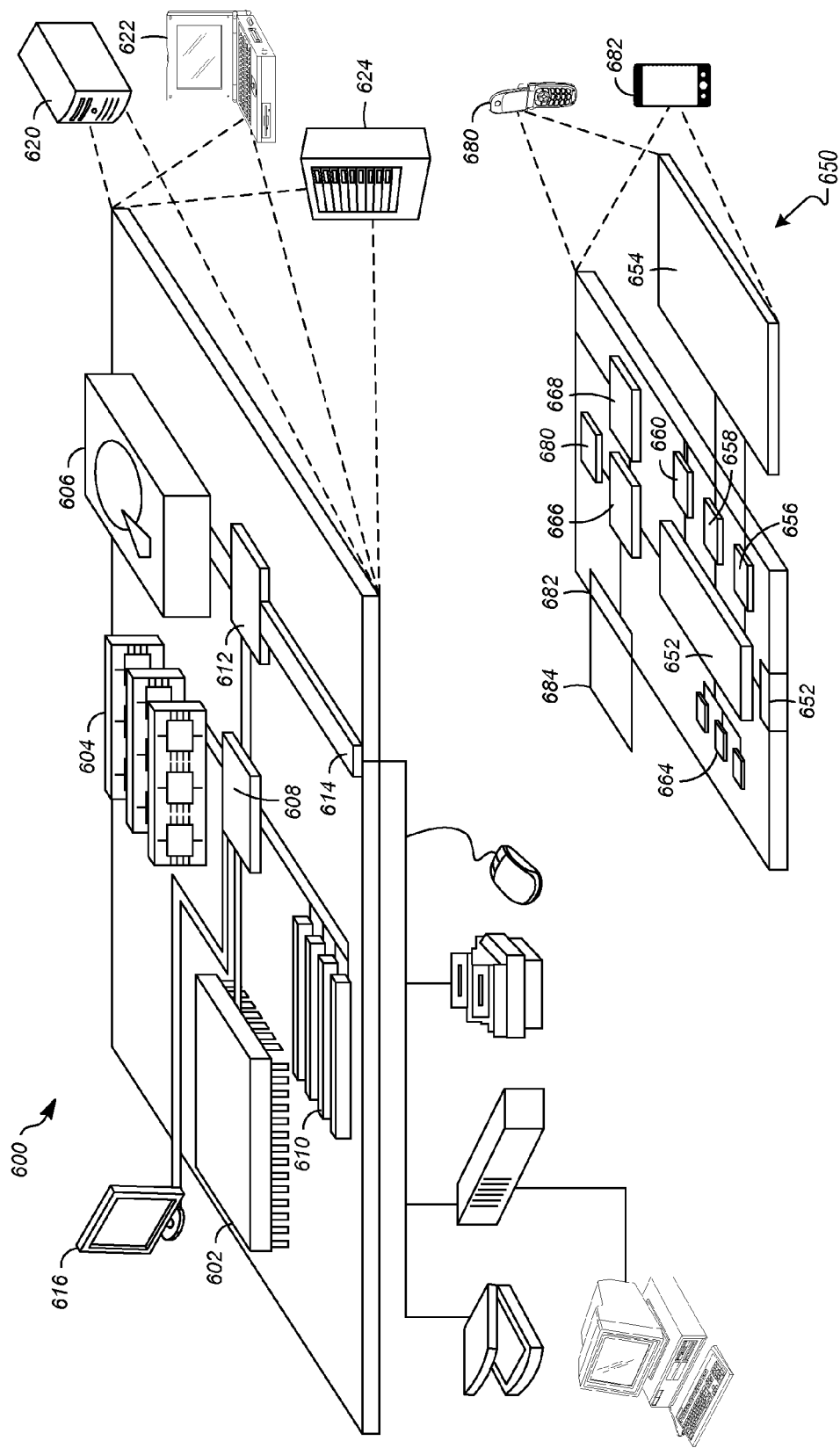
FIG. 6 illustrates an example of a computer device and a mobile computer device that can be used with circuits described here.

FIG. 6 illustrates an example of a generic computer device 600 and a generic mobile computer device 650, which may be used with the techniques described here.

As shown in FIG. 6, computing device 600 is intended to represent various forms of digital computers, such as laptops, desktops, workstations, personal digital assistants, servers, blade servers, mainframes, and other appropriate computers. Computing device 650 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 600 includes a processor 602, memory 604, a storage device 606, a high-speed interface 608 connecting to memory 604 and high-speed expansion ports 610, and a low speed interface 612 connecting to low speed bus 614 and storage device 606. Each of the components 602, 604, 606, 608, 610, and 612, are interconnected using various busses, and may be mounted on a common motherboard or in other manners as appropriate. The processor 602 can process instructions for execution within the computing device 600, including instructions stored in the memory 604 or on the storage device 606 to display graphical information for a GUI on an external input/output device, such as display 616 coupled to high speed interface 608. In other implementations, multiple processors and/or multiple buses may be used, as appropriate, along with multiple memories and types of memory. Also, multiple computing devices 600 may be connected, with each device providing portions of the necessary operations (e.g., as a server bank, a group of blade servers, or a multi-processor system).

The memory 604 stores information within the computing device 600. In one implementation, the memory 604 is a volatile memory unit or units. In another implementation, the memory 604 is a non-volatile memory unit or units. The memory 604 may also be another form of computer-readable medium, such as a magnetic or optical disk.

The storage device 606 is capable of providing mass storage for the computing device 600. In one implementation, the storage device 606 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 604, the storage device 606, or memory on processor 602.

The high speed controller 608 manages bandwidth-intensive operations for the computing device 500, while the low speed controller 612 manages lower bandwidth-intensive operations. Such allocation of functions is exemplary only. In one implementation, the high-speed controller 608 is coupled to memory 604, display 616 (e.g., through a graphics processor or accelerator), and to high-speed expansion ports 610, which may accept various expansion cards (not shown). In the implementation, low-speed controller 612 is coupled to storage device 506 and low-speed expansion port 614. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 600 may be implemented in a number of different forms, as shown in the figure. For example, it may be implemented as a standard server 620, or multiple times in a group of such servers. It may also be implemented as part of a rack server system 624. In addition, it may be implemented in a personal computer such as a laptop computer 622. Alternatively, components from computing device 600 may be combined with other components in a mobile device (not shown), such as device 650. Each of such devices may contain one or more of computing device 600, 650, and an entire system may be made up of multiple computing devices 600, 650 communicating with each other.

Computing device 650 includes a processor 652, memory 664, an input/output device such as a display 654, a communication interface 666, and a transceiver 668, among other components. The device 650 may also be provided with a storage device, such as a microdrive or other device, to provide additional storage. Each of the components 650, 652, 664, 654, 666, and 668, are interconnected using various buses, and several of the components may be mounted on a common motherboard or in other manners as appropriate.

The processor 652 can execute instructions within the computing device 650, including instructions stored in the memory 664. The processor may be implemented as a chipset of chips that include separate and multiple analog and digital processors. The processor may provide, for example, for coordination of the other components of the device 650, such as control of user interfaces, applications run by device 650, and wireless communication by device 650.

Processor 652 may communicate with a user through control interface 658 and display interface 656 coupled to a display 654. The display 654 may be, for example, a TFT LCD (Thin-Film-Transistor Liquid Crystal Display) or an OLED (Organic Light Emitting Diode) display, or other appropriate display technology. The display interface 656 may comprise appropriate circuitry for driving the display 654 to present graphical and other information to a user. The control interface 658 may receive commands from a user and convert them for submission to the processor 652. In addition, an external interface 662 may be provided in communication with processor 652, so as to enable near area communication of device 650 with other devices. External interface 662 may provide, for example, for wired communication in some implementations, or for wireless communication in other implementations, and multiple interfaces may also be used.

The memory 664 stores information within the computing device 650. The memory 664 can be implemented as one or more of a computer-readable medium or media, a volatile memory unit or units, or a non-volatile memory unit or units. Expansion memory 674 may also be provided and connected to device 650 through expansion interface 672, which may include, for example, a SIMM (Single In Line Memory Module) card interface. Such expansion memory 674 may provide extra storage space for device 650, or may also store applications or other information for device 650. Specifically, expansion memory 674 may include instructions to carry out or supplement the processes described above, and may include secure information also. Thus, for example, expansion memory 674 may be provided as a security module for device 650, and may be programmed with instructions that permit secure use of device 650. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 664, expansion memory 674, or memory on processor 652, that may be received, for example, over transceiver 668 or external interface 662.

Device 650 may communicate wirelessly through communication interface 666, which may include digital signal processing circuitry where necessary. Communication interface 666 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 668. In addition, short-range communication may occur, such as using a Bluetooth, WiFi, or other such transceiver (not shown). In addition, GPS (Global Positioning System) receiver module 670 may provide additional navigation- and location-related wireless data to device 650, which may be used as appropriate by applications running on device 650.

Device 650 may also communicate audibly using audio codec 660, which may receive spoken information from a user and convert it to usable digital information. Audio codec 660 may likewise generate audible sound for a user, such as through a speaker, e.g., in a handset of device 650. Such sound may include sound from voice telephone calls, may include recorded sound (e.g., voice messages, music files, etc.) and may also include sound generated by applications operating on device 650.

The computing device 650 may be implemented in a number of different forms, as shown in the figure. For example, it may be implemented as a cellular telephone 680. It may also be implemented as part of a smart phone 682, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A computer-implemented method, comprising:
   receiving, by processing circuitry of the computer, a first plurality of bit strings;
   producing, by the processing circuitry, upper bound data based on the first plurality of bit strings, the upper bound data indicating, for each of the first plurality of bit strings, a leftmost bit of that bit string;
   generating, by the processing circuitry, a second plurality of bit strings from the first plurality of bit strings and the upper bound data, each of the second plurality of bit strings including a bit from a respective bit string of the first plurality of bit strings, each bit of each of the second plurality of bit strings having the same position from the leftmost bit indicated by the upper bound data of its respective bit string of the first plurality of bit strings; and
   performing, by the processing circuitry, a compression operation on each of the second plurality of bit strings to (i) produce a plurality of compressed bit strings and (ii) reduce an amount of storage in a storage device of the computer consumed by the plurality of compressed bit strings by the performance of a compression operation on each of the second plurality of bit strings rather than each of the first plurality of bit strings.

2. The computer-implemented method as in claim 1, wherein each of the first plurality of bit strings represents a number of points of a point cloud enclosed within a respective subdivision of a series of subdivisions of a bounding box, and
   wherein producing the upper bound data includes, for each of the first plurality of bit strings, generating a number of bits in a bit string representing a number of points in a previous subdivision of the bounding box.

3. The computer-implemented method as in claim 2, wherein generating the second plurality of bit strings from the first plurality of bit strings includes:
   defining a sequence in which the second plurality of bit strings is generated from the first plurality of bit strings, each of the second plurality of bit strings having a sequence number in the sequence; and
   for each of the second plurality of bit strings, adding a bit from a particular bit string of the first plurality of bit strings according to whether the leftmost bit of the particular bit string is greater than or less than the sequence number of that bit string of the second plurality of bit strings in the sequence.

4. The computer-implemented method as in claim 2, further comprising receiving sequencing data indicating a sequential order into which the series of subdivisions of the bounding box were generated.

5. The computer-implemented method as in claim 2, further comprising:
   performing a decompression operation on each of the compressed bit strings to produce the second plurality of bit strings; and
   performing a bit string unfolding operation on the second plurality of bit strings using the upper bound data to produce the first plurality of bit strings.

6. The computer-implemented method as in claim 1, wherein performing the compression operation includes applying a respective arithmetic encoder to each of the second plurality of bit strings to produce, for each of the plurality of compressed bit strings, a single number as a compressed bit string.

7. The computer-implemented method as in claim 1, wherein producing the upper bound data based on the first plurality of bit strings includes retrieving the upper bound data from memory of the computer.

8. A computer program product comprising a nontransitive storage medium, the computer program product including code that, when executed by processing circuitry, causes the processing circuitry to perform a method, the method comprising:

receiving a first plurality of bit strings;

producing upper bound data based on the first plurality of bit strings, the upper bound data indicating, for each of the first plurality of bit strings, a leftmost bit of that bit string;

generating a second plurality of bit strings from the first plurality of bit strings and the upper bound data, each of the second plurality of bit strings including a bit from a respective bit string of the first plurality of bit strings, each bit of each of the second plurality of bit strings having the same position from the leftmost bit indicated by the upper bound data of its respective bit string of the first plurality of bit strings; and performing a compression operation on each of the second plurality of bit strings to (i) produce a plurality of compressed bit strings and (ii) reduce an amount of storage in a storage device of the computer consumed by the plurality of compressed bit strings by the performance of a compression operation on each of the second plurality of bit strings rather than each of the first plurality of bit strings.

9. The computer program product as in claim 8, wherein each of the first plurality of bit strings represents a number of points of a point cloud enclosed within a respective subdivision of a series of subdivisions of a bounding box, and wherein producing the upper bound data includes, for each of the first plurality of bit strings, generating a number of bits in a bit string representing a number of points in a previous subdivision of the bounding box.

10. The computer program product as in claim 9, wherein generating the second plurality of bit strings from the first plurality of bit strings includes:

defining a sequence in which the second plurality of bit strings is generated from the first plurality of bit strings, each of the second plurality of bit strings having a sequence number in the sequence; and for each of the second plurality of bit strings, adding a bit from a particular bit string of the first plurality of bit strings according to whether the leftmost bit of the particular bit string is greater than or less than the sequence number of that bit string of the second plurality of bit strings in the sequence.

11. The computer program product as in claim 9, wherein the method further comprises receiving sequencing data indicating a sequential order into which the series of subdivisions of the bounding box were generated.

12. The computer program product as in claim 9, wherein the method further comprises:

performing a decompression operation on each of the compressed bit strings to produce the second plurality of bit strings; and performing a bit string unfolding operation on the second plurality of bit strings using the upper bound data to produce the first plurality of bit strings.

13. The computer program product as in claim 8, wherein performing the compression operation includes applying a respective arithmetic encoder to each of the second plurality of bit strings to produce, for each of the plurality of compressed bit strings, a single number as a compressed bit string.

14. The computer program product as in claim 8, wherein producing the upper bound data based on the first plurality of bit strings includes retrieving the upper bound data from memory of the computer.

15. An apparatus, comprising:

a network interface;

memory; and controlling circuitry coupled to the memory, the controlling circuitry being configured to:

receive a first plurality of bit strings;

produce upper bound data based on the first plurality of bit strings, the upper bound data indicating, for each of the first plurality of bit strings, a leftmost bit of each of that bit string;

generate a second plurality of bit strings from the first plurality of bit strings and the upper bound data, each of the second plurality of bit strings including a bit from a respective bit string of the first plurality of bit strings, each bit of each of the second plurality of bit strings having the same position from the leftmost bit indicated by the upper bound data of its respective bit string of the first plurality of bit strings; and perform a compression operation on each of the second plurality of bit strings to (i) produce a plurality of compressed bit strings and (ii) reduce an amount of storage in a storage device of the computer consumed by the plurality of compressed bit strings by the performance of a compression operation on each of the second plurality of bit strings rather than each of the first plurality of bit strings.

16. The apparatus as in claim 15, wherein each of the first plurality of bit strings represents a number of points of a point cloud enclosed within a respective subdivision of a series of subdivisions of a bounding box, and wherein the controlling circuitry configured to produce the upper bound data is further configured to, for each of the first plurality of bit strings, generate a number of bits in a bit string representing a number of points in a previous subdivision of the bounding box.

17. The apparatus as in claim 16, wherein the controlling circuitry configured to generate the second plurality of bit strings from the first plurality of bit strings is further configured to:

define a sequence in which the second plurality of bit strings is generated from the first plurality of bit strings, each of the second plurality of bit strings having a sequence number in the sequence; and for each of the second plurality of bit strings, add a bit from a particular bit string of the first plurality of bit strings according to whether the leftmost bit of the particular bit string is greater than or less than the sequence number of that bit string of the second plurality of bit strings in the sequence.

18. The apparatus as in claim 16, wherein the controlling circuitry is further configured to receive sequencing data indicating a sequential order into which the series of subdivisions of the bounding box were generated.

19. The apparatus as in claim 16, wherein the controlling circuitry is further configured to:

perform a decompression operation on each of the compressed bit strings to produce the second plurality of bit strings; and perform a bit string unfolding operation on the second plurality of bit strings using the upper bound data to produce the first plurality of bit strings.

20. The apparatus as in claim 15, wherein the controlling circuitry configured to perform the compression operation is further configured to apply a respective arithmetic encoder to each of the second plurality of bit strings to produce, for each of the plurality of compressed bit strings, a single number as a compressed bit string.

* * * * *